United States Patent [19]

Kamo

[11] Patent Number: 4,989,542
[45] Date of Patent: Feb. 5, 1991

[54] APPARATUS FOR SYNTHESIZING DIAMOND
[75] Inventor: Mutsukazu Kamo, Tsuchiura, Japan
[73] Assignee: National Institute for Research in Inorganic Materials, Tsukuba, Japan
[21] Appl. No.: 197,916
[22] Filed: May 24, 1988
[30] Foreign Application Priority Data Jul. 21, 1987 [JP] Japan .................. 62-181790

[51] Int. Cl.$^5$ .................. C23C 16/48; C23C 16/50
[52] U.S. Cl. .................. 118/723; 427/39; 423/446
[58] Field of Search .................. 118/723; 427/39; 423/446

[56] References Cited
U.S. PATENT DOCUMENTS

| 3,911,318 | 10/1975 | Spero | 315/39 |
| 4,729,341 | 3/1988 | Fournier | 427/38 |
| 4,776,918 | 10/1988 | Otsubo | 427/38 |
| 4,869,924 | 9/1989 | Ito | 118/723 |

FOREIGN PATENT DOCUMENTS 61-36200 2/1986 Japan .
62-44578 2/1987 Japan .................. 118/723
62-298106 12/1987 Japan .................. 118/723

OTHER PUBLICATIONS

Kawarada et al, Japanese Journal of Applied Physics vol. 26, No. 6, Jun., 1987 pp. L1032–L1034.

Primary Examiner—Richard Bueker
Attorney, Agent, or Firm—Oblon, Spivak, McClelland, Maier & Neustadt

[57] ABSTRACT

An apparatus for synthesizing diamond, which comprises a reaction chamber, a means for supplying to the reaction chamber a gas mixture comprising a hydrogen gas and an organic compound decomposable by a plasma to form a diamond or a gas mixture comprising a hydrogen gas, an inert gas and said organic compound, a means of conducting a microwave of frequency larger than 300 MHz to the reaction chamber to generate a microwave plasma in the gas mixture and a substrate held by a substrate holder to locate in the microwave plasma and on which diamond is to be formed, wherein the microwave conducting means is designed to introduce the microwave to the reaction chamber from a plurality of directions.

8 Claims, 3 Drawing Sheets

APPARATUS FOR SYNTHESIZING DIAMOND

BACKGROUND OF THE INVENTION

1. Field of the Invention

The present invention relates to an apparatus for synthesizing diamond from a gas phase. More particularly, it relates to an apparatus wherein the diamond precipitating area is enlarged.

2. Discussion of Background

The following apparatus have been known for the synthesis of diamond by a microwave plasma method.

FIGS. 6 to 8 illustrate apparatus for synthesizing diamond by means of a microwave plasma. FIGS. 6 and 7 illustrate apparatus for synthesizing diamond wherein a microwave generated by a microwave oscillator 3 is conducted to a reaction chamber 5 by a wave guide 4 to generate a plasma in a gas mixture of hydrogen and a hydrocarbon gas, and a substrate 7 provided in the reaction chamber 5 is heated by a heating furnace 9 or an infrared lamp image furnace 10 to decompose the hydrocarbon to form diamond on the substrate 7. In FIG. 8, a microwave is generated by a microwave oscillator 3 and introduced to a reaction chamber 5 via a wave guide 4 to generate a plasma in a gas mixture of hydrogen and a hydrocarbon gas supplied from a gas supply device 1, around a substrate 7 provided at the intersection of the reaction chamber 5 and the wave guide 4 and at the same time the substrate 7 is heated. Diamond precipitates on the substrate 7 by the thermal decomposition of the hydrocarbon on the heated substrate 7. Reference numerals 12, 13, 14, 15 and 16 indicate cocks.

According to such conventional methods, however, the microwave is introduced from only one direction, and the plasma forming area is restricted by the wavelength of the microwave, whereby it is difficult to enlarge the size of the reaction chamber 5 beyond one half of the wavelength of the microwave. Accordingly, the diamond precipitating area is likewise restricted to a diameter corresponding to one half of the microwave at the maximum.

SUMMARY OF THE INVENTION

It is an object of the present invention to overcome such a drawback and to provide an apparatus wherein the plasma forming space is enlarged and the diamond precipitating area is accordingly enlarged. It has been found possible to accomplish this object by introducing the microwave from a plurality of directions.

The present invention provides an apparatus for synthesizing diamond, which comprises a reaction chamber, a means for supplying to the reaction chamber a gas mixture comprising a hydrogen gas and an organic compound decomposable by a plasma to form a diamond or a gas mixture comprising a hydrogen gas, an inert gas and said organic compound, a means of conducting a microwave of frequency larger than 300 MHz to the reaction chamber to generate a microwave plasma in the gas mixture and a substrate held by a substrate holder to locate in the microwave plasma and on which diamond is to be formed, wherein the microwave conducting means is designed to introduce the microwave to the reaction chamber from a plurality of directions.

Namely, according to the present invention, the above object has been accomplished by introducing the microwave to the gas mixture from a plurality of directions so that a plasma is generated in a wide space with a diameter larger than one half of the wavelength of the microwave and diamond is precipitated in a correspondingly wide area by the thermal decomposition of the organic compound on a plurality of heated substrate plates held by a multi-plate substrate holder.

DETAILED DESCRIPTION OF THE PREFERRED EMBODIMENTS

Figure 1:
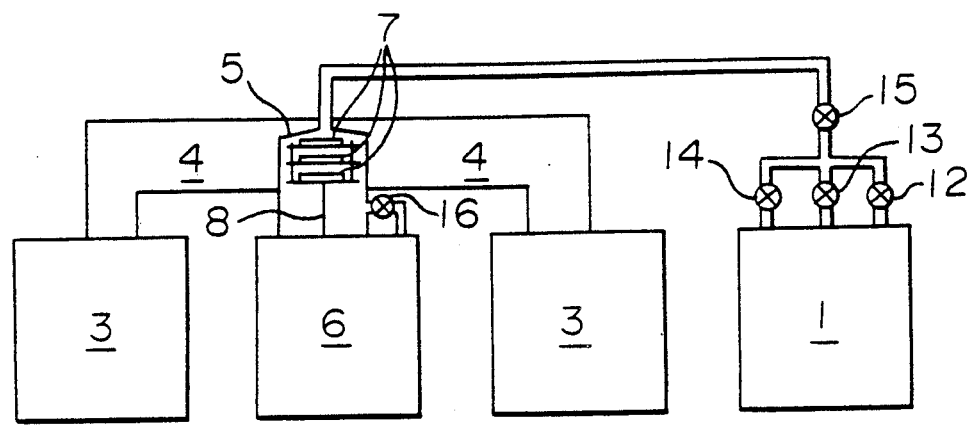
FIGS. 1 to 5 illustrate different embodiments of the apparatus of the present invention.

The number of directions for introducing the microwave is determined depending upon the diameter of the reaction chamber and the size of the wave guide for introduction of the microwave. When the diameter of the reaction chamber is not larger than 100 mm, two directions are sufficient. When the diameter is 150 mm, the microwave may be introduced from four directions. The number of directions for introducing the microwave is determined so that the generated plasma has a uniform shape, and it may not necessarily be the maximum number.

The mixing ratio of the organic compound and the hydrogen gas in the gas mixture to be used, may be varied within a wide range. However, in order to avoid the precipitation of graphite or non-diamond carbon, the upper limit of the $C/H_2$ ratio in the gas mixture is preferably not higher than 10. To precipitate a diamond film of a high quality, the $C/H_2$ ratio is preferably not higher than 0.1.

The organic compound decomposable by a plasma to form a diamond is preferably an organic compound which is gaseous or has a vapor pressure of at least 1/1,000 Torr within a temperature range of from room temperature to 50° C. For example, it may be a saturated aliphatic hydrocarbon such as methane, ethane, propane or butane, an unsaturated aliphatic hydrocarbon such as ethylene, propylene or acetylene, an aromatic hydrocarbon such as benzene, or an oxygen- or nitrogen-containing organic compound such as acetone, methyl alcohol, ethyl alcohol, acetaldehyde, acetic acid, carbon monoxide, carbon dioxide or trimethylamine. For the convenience of the operation and the simplicity of the apparatus, it is preferably gaseous at room temperature.

The substrate temperature is required to be a temperature capable of preventing a transformation of the precipitated diamond to graphite and capable of inducing the organic compound under an exited condition to undergo thermal decomposition on the surface of the substrate. Accordingly, it is preferably within a range of from 300° to 1,300° C., more preferably from 400° to 1,000° C.

The pressure in the reaction chamber is preferably within a range of from 0.1 to 400 Torr to obtain diamond of a uniform film form, although the precipitation of diamond may be accomplished within a pressure range of from 0.001 to 1,000 Torr within which a plasma is generated by a microwave.

Diamond forms within a space where the plasma is generated. Therefore, the substrate may be located at any place within the plasma space. In the case of a multi-plate substrate holder, a plurality of substrate plates may be disposed so closely to one another that no substantial space is present therebetween. However, in order to obtain a uniform and homogeneous diamond, the substrate plates are preferably held with a distance of from 5 to 50 mm from one another.

In order to minimize the influence of the flow of the gas in the reaction chamber over the formation of diamond, the substrate holder is preferably rotated at a rotational speed of from 0.01 to 100 rpm. In order to obtain a uniform and homogeneous diamond film, it is preferred to rotate the substrate holder at a rotational speed of from 0.1 to 20 rpm.

Depending upon the shape or the type of material of the substrate, the plasma density is likely to increase along the periphery of the substrate and the temperature distribution on the substrate tends to be non-uniform, whereby it becomes difficult to obtain a uniform diamond film. In the case of such a substrate, it is desirable to provide a microwave absorber around the substrate to suit the shape of the substrate. In order to avoid an inclusion of impurities, a shaped body of carbon is preferably used for this purpose.

Figure 2:
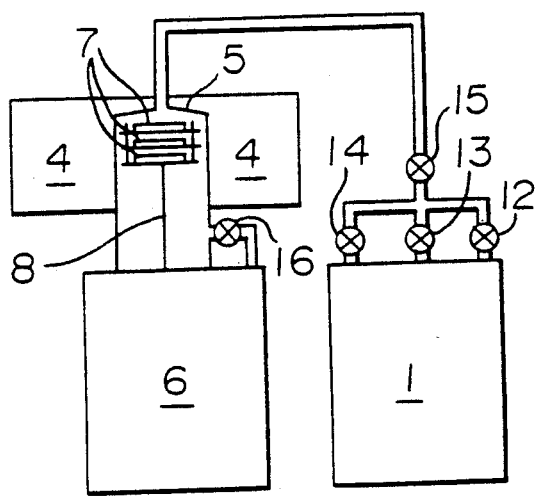
Figure 2:
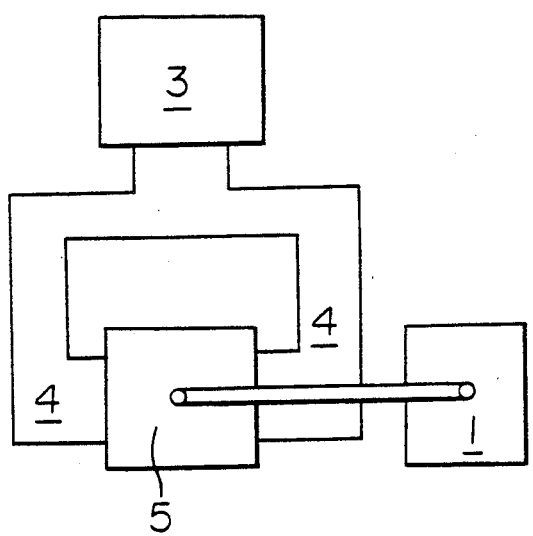
Figure 3:
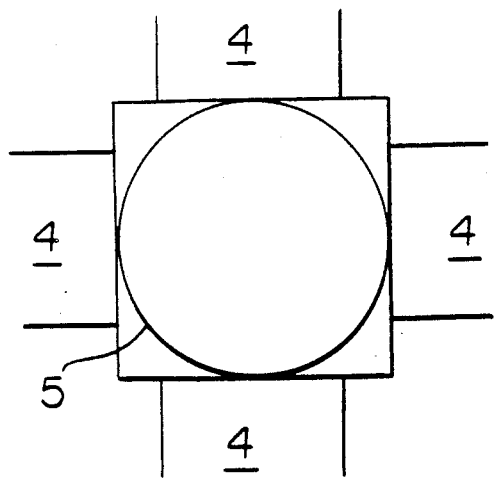
Figure 4:
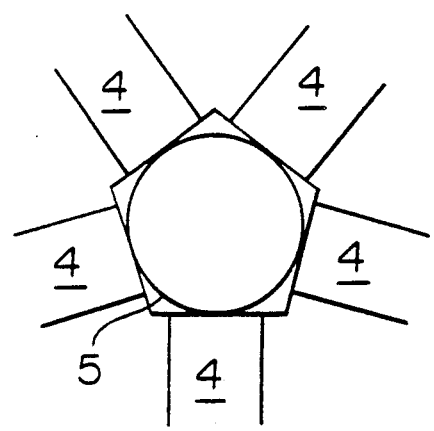
Figure 5:
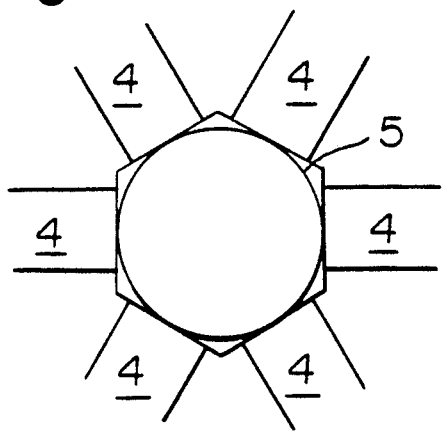
Figure 6:
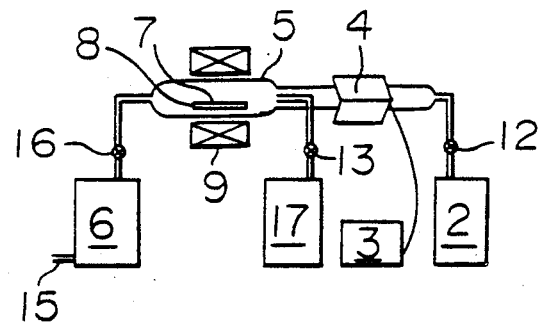
FIGS. 6 to 8 illustrate conventional apparatus for synthesizing diamond by a microwave plasma.
Figure 7:
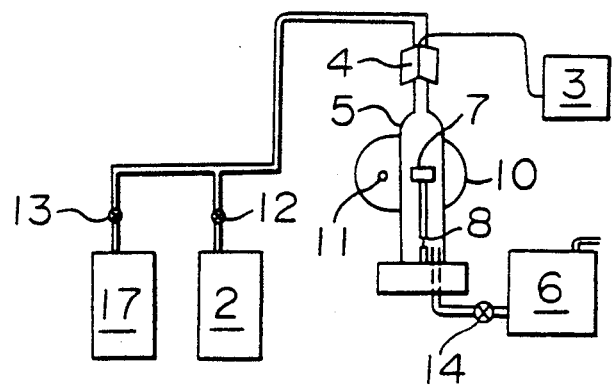
Figure 8:
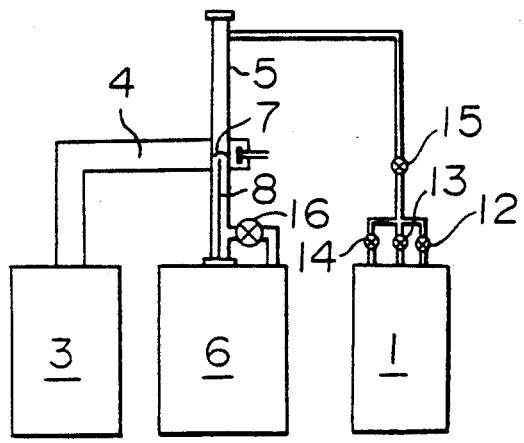

Various embodiments of the apparatus of the present invention are shown in FIGS. 1 to 5. FIG. 1 illustrates an apparatus wherein a microwave generated from two oscillators 3 is introduced to a reaction chamber 5 via wave guides 4 from two directions to generate a plasma. FIG. 2 illustrates an apparatus wherein a microwave generated from one oscillator 3 is divided and introduced via wave guides 4 to a reaction chamber 5 from two directions to generate a plasma. FIG. 2a shows the front view of the apparatus, and FIG. 2b shows the top view of the apparatus. FIGS. 3 to 5 illustrate different embodiments for the introduction of the microwave to the reaction chamber from a plurality of directions, and the rest of the construction of the apparatus is the same as illustrated in FIG. 1 or 2. In the Figures, reference numeral 1 indicates a gas supply device, and numerals 12, 13 and 14 are cocks for supplying the organic compound, the hydrogen gas and the inert gas, respectively. Numeral 3 indicates a microwave oscillator, and the microwave passes through wave guides 4 and reach substrate plates 7 in a reaction chamber 5. Numeral 8 indicates a substrate holder, numeral 6 indicates an evacuation device, and numerals 15 and 16 are cocks. The operation is such that after placing substrate plates 7 on the substrate holder 8 in the reaction chamber 5, the evacuation device 6 is operated to bring the reaction chamber 5 under reduced pressure. Then, the cocks 12, 13 and 14 of the gas supply device 1 are opened to supply the organic compound, the hydrogen gas and the inert gas, and the cock 15 is opened to control the flow rate and the proportion of the gas mixture and to maintain the pressure in the reaction chamber 5 to a predetermined level. Then, the microwave oscillator 3 is operated, and the microwave is introduced to the reaction chamber 5 via the wave guides 4 from a plurality of directions as shown in FIGS. 1 to 5, to generate a microwave plasma.

For the introduction of the microwave from a plurality of directions, a plurality of oscillators may be employed depending upon the microwave output and the substrate temperature required.

Now, the present invention will be described in further detail with reference to Examples. However, it should be understood that the present invention is by no means restricted to such specific Examples.

EXAMPLE 1

By using the apparatus as shown in FIG. 1, a 4 inch silicon wafer scratched by diamond powder was used as a substrate 7, and methane and hydrogen were used as gases. Hydrogen and methane were supplied at flow rates of 100 cc/min and 1 cc/min, respectively, and the pressure in the reaction chamber 5 was adjusted to 30 Torr. A microwave generated at an output of 700 W each from the two microwave oscillators 3 was conducted via the wave guides 4 to the reaction chamber 5 to generate a plasma around the substrate 7 and to maintain the substrate temperature at a level of 900° C. Five hours later, diamond deposited on the substrate in a thickness of 5 $\mu$m with a diameter of 70 mm.

EXAMPLE 2

By using the apparatus as shown in FIG. 2, three 5 inch wafers scratched by diamond powder and held by a 3-plate substrate holder 8 with a distance of 10 mm were set in the reaction chamber 5. As the gases, hydrogen and acetylene were supplied at flow rates of 200 cc/min and 1 cc/min, respectively, and the pressure in the reaction chamber was maintained at a level of 20 Torr. Then, while rotating the substrate holder 8 at a rotational speed of 5 rpm, a microwave was generated by a microwave oscillator 3 to generate a plasma at an output of 1.2 kW and the substrate temperature was maintained at a level of 870° C.

Eight hours later, a diamond film having a thickness of 8 $\mu$m deposited on the entire surface of the 5 inch wafer substrate.

EXAMPLE 3

By using an apparatus designed to introduce a microwave from four directions as shown in FIG. 4, three 4 inch wafers scratched by diamond powder were placed on a 1-plate substrate holder 8. As the gases, hydrogen, argon and ethyl alcohol were supplied at flow rates of 250 cc/min, 50 cc/min and 1 cc/min, respectively, and the pressure in the reaction chamber was maintained at a level of 10 Torr.

Then, while rotating the substrate holder 8 at a rotational speed of 10 rpm, a microwave was generated from the two microwave oscillators 3 to generate a plasma at an output of 2 kW each, and the substrate temperature was maintained at a level of 950° C. Ten hours later, a diamond film having a thickness of about 15 $\mu$m deposited on the entire surface of the 4 inch wafer substrate plates.

EXAMPLE 4

By using an apparatus designed to introduce a microwave from six directions as shown in FIG. 5, 30 super hard tool chips surround by a molded product of carbon were placed on each plate of a 4-plate substrate holder 8 and set in the reaction chamber 5. As the gases, hydrogen and carbon monoxide were supplied at flow rates of 30 cc/min and 5 cc/min, respectively, and the pressure in the reaction chamber was maintained at a level of 15 Torr. Then, while rotating the substrate holder 8 at a rotational speed of b 15 rpm, a microwave was generated with an output of 3 kW each from the three oscillators 3, and each microwave was divided into two. Thus, the microwave was introduced from six directions to generate a plasma in the reaction chamber 5, and the substrate temperature was maintained at 8320° C. Five hours later, a diamond film having a thickness of about 5 μm deposited on the super hard tool chips.

With the apparatus for synthesizing diamond of the present invention, a microwave is introduced from a plurality of directions, whereby the plasma forming space can be enlarged, and the diamond forming area can be widened, thus making mass production possible.

What is claimed is:

1. An apparatus for synthesizing diamond, which comprises:
   (a) a reaction chamber,
   (b) means for supplying to the reaction chamber a gas mixture comprising hydrogen gas and an organic compound decomposable by a plasma to form diamond, or a gas mixture comprising hydrogen gas, an inert gas and said organic compound,
   (c) means of conducting a microwave having a frequency larger than 300 MHz to the reaction chamber to generate a microwave plasma in the gas mixture, and
   (d) one or more substrates held by one or more substrates holders to locate in the microwave plasma and on which said diamond is to be formed, wherein said microwave conducting means is designed to introduce the microwave to the reaction chamber from a plurality of directions, and further wherein a microwave absorber is placed around said one or more substrates, to the shape thereof.

2. The apparatus for synthesizing diamond according to claim 1, wherein the number of directions for introducing said microwave is determined so that the generated plasma has a uniform shape.

3. The apparatus for synthesizing diamond according to claim 1, wherein said one or more substrate holders are each capable of being rotated at a rotational speed of from 0.01 to 100 rpm.

4. The apparatus for synthesizing diamond according to claim 1, wherein said shaped microwave absorber placed around said one or more substrates is made of carbon.

5. The apparatus for synthesizing diamond according to claim 1, wherein said microwave conducting means is designed to introduce the microwave to the reaction chamber from two, three, four, five or six different directions.

6. The apparatus for synthesizing diamond according to claim 1, wherein said substrate is a silicon wafer scratched by diamond powder.

7. The apparatus for synthesizing diamond according to claim 1, wherein the substrate comprises a plurality of substrate plates held by the substrate holder with a distance from one another.

8. The apparatus for synthesizing diamond according to claim 7, wherein the distance is from 5 to 50 mm.

* * * * *